June 26, 1962 S. L. MATLOW ET AL 3,040,416

METHOD OF MAKING A LARGE AREA SOLAR CELL PANEL

Filed May 13, 1959

EUGENE L. RALPH
SHELDON L. MATLOW
INVENTORS.

BY [signature]

ATTORNEY.

United States Patent Office 3,040,416

Patented June 26, 1962

3,040,416

METHOD OF MAKING A LARGE AREA SOLAR CELL PANEL

Sheldon L. Matlow, Chicago, and Eugene L. Ralph, Skokie, Ill., assignors to Hoffman Electronics Corporation, a corporation of California Filed May 13, 1959, Ser. No. 812,970

7 Claims. (Cl. 29—155.5)

The present invention relates to methods of making a large area solar cell panel, and more particularly to methods of joining individual semiconductor pieces electrically and mechanically so as to form a large area solar cell panel.

The use of photovoltaic cells, commonly called solar cells, is well known in the art. Solar cells are conventionally obtained as slices cut from specially prepared single crystal semiconductor ingots. The greater the area of a solar cell, the greater is the power obtained from the cell. But, the greater the area, the less is the efficiency of the cell. By connecting many little cells together as a panel, it is possible to increase the power without decreasing the efficiency. Current methods of interconnecting many solar cells are expensive, inconvenient and unreliable.

It is an object of the present invention, therefore, to provide a novel method of making a large area solar cell panel.

It is another object of the present invention to provide a method of electrically and mechanically connecting together individual solar cells.

According to the present invention, a method is provided for interconnecting small pieces of semiconductor material so that all p-type regions are connected together and all n-type regions are connected together, by metal conductors. The semiconductor particles are embedded in insulating material for support and insulation.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which, FIGURE 1 is a plan view of a large area solar cell made by the method of the present invention.

Figure 1:
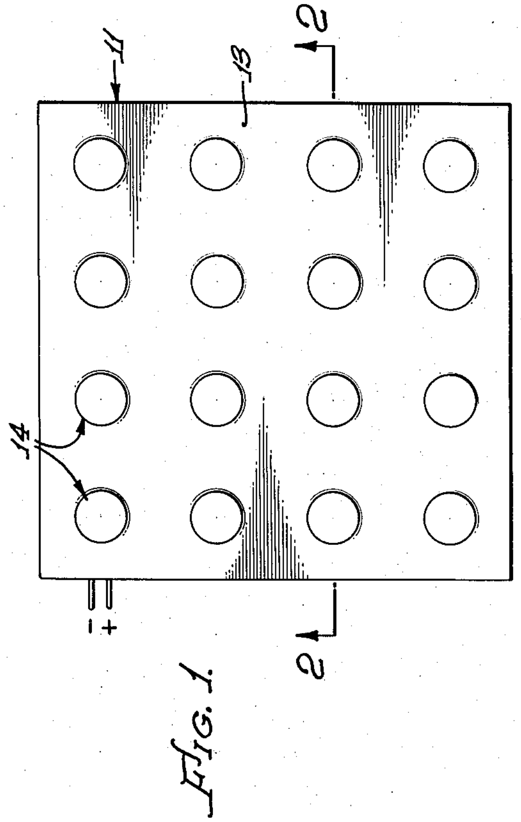
Figure 2:
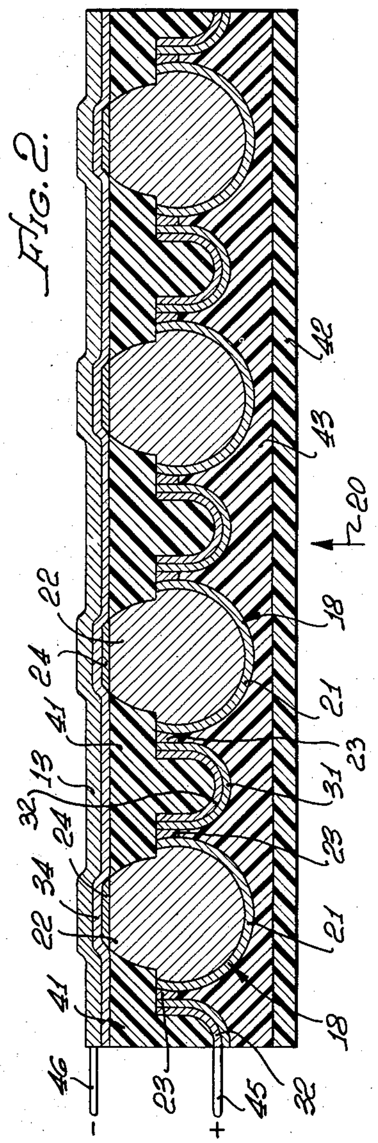

FIGURE 2 is a sectional view taken along line 2—2 of FIGURE 1.

Referring now to the drawings, FIGURE 1 shows solar cell panel 11 covered by copper layer 13. A plurality of solar cells lies under copper layer 13 in a convenient pattern, as indicated by bulges 14.

FIGURE 2 shows solar cells 18, which by way of example are shown to be spherical, positioned so as to be able to receive solar energy coming from below, as indicated by arrow 20. Solar cells 18 comprise p-type silicon regions 21 and n-type silicon regions 22. Gold layers 23 make ohmic contact with p-type silicon regions 21, and gold layers 24 make ohmic contact with n-type silicon regions 22. Silver layer 31 and copper layer 32 connect p-type regions 21 of solar cells 18 together electrically, and silver layer 34 and copper layer 13 connect n-type regions 22 of solar cells 18 together electrically. The metal layers are separated by plastic insulator layer 41. A method of obtaining the panel shown in FIGURES 1 and 2 will now be described.

Transparent acrylic plastic sheet 42 is cut to size and transparent liquid plastic layer 43 is calendered onto plastic sheet 42. Solar cells 18, each having a diffused p-type region covering it, are partially embedded in plastic layer 43, which is then hardened. P-type regions 21 are then electrolessly plated with gold layers 23 to obtain ohmic contacts. Silver layer 31 is deposited onto gold layers 23 by precipitation to connect p-type regions 21 electrically, and copper layer 32 is electrodeposited onto silver layer 31 to reduce the resistance. Plastic layer 41 is placed over the metal layers and solar cells 18 are lapped, ground, or sandblasted to expose n-type regions 22. Each exposed region is etched to clean the edge of the exposed p-n junction and the junction surface is recovered with plastic layer 41. Solar cells 18 are again lapped, ground or sandblasted until n-type regions 22 are just exposed.

Each exposed region is electrolessly plated with a gold layer 24 to obtain an ohmic contact. Silver layer 34 is then deposited onto gold layers 24 by precipitation to connect n-type regions 22 electrically, and copper layer 13 is electrodeposited onto silver layer 34 to reduce the resistance. The finished product will have the configuration shown in FIGURES 1 and 2, and positive terminal 45 may be connected to copper layer 32 while negative terminal 46 may be connected to copper layer 13.

It is essential that there be no direct ohmic connection between p-type regions 21 and n-type regions 22, since such a direct ohmic connection would short circuit solar cells 18 and would result in there being no electrical output between terminals 45 and 46.

Each solar cell 18 is connected in parallel with every other cell by reason of copper layer 32, which is in electrical contact with all p-type regions 21, and copper layer 13, which is in electrical contact with all n-type regions 22. Thus, the present invention provides a relatively inexpensive method of obtaining a large-area solar cell panel without loss of conversion efficiency.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

We claim:

1. A method of making a large area solar cell panel comprising the steps of: partially embedding a plurality of semiconductor pieces in a transparent non-conductive supporting material, each piece having an outer first type conductivity region and an inner second type conductivity region separated therefrom by a p-n junction; making an ohmic contact to each of said first type conductivity regions; depositing a first metal layer so as to electrically connect together the ohmic contacts of said first type conductivity regions; covering said first metal layer with an insulating material; removing said outer first type conductivity region from a portion of each of said pieces, thereby exposing said inner second type conductivity regions, each of said exposed second type conductivity regions facing generally the same direction; covering a portion of each of said exposed second type conductivity regions with an insulating material; making an ohmic contact to each of said second type conductivity regions; and depositing a second metal layer so as to connect together electrically the ohmic contacts of said second type conductivity regions.

2. A method as defined in claim 1 in which said semiconductor pieces are sphere-like in shape, said first type conductivity region comprises p-type silicon, said second type conductivity region comprises n-type silicon, said ohmic contacts comprise deposited gold, and said first and second metal layers each comprise a layer of copper deposited upon a layer of silver.

3. A method of making a large area solar cell panel comprising the steps of: partially embedding a plurality of semiconductor pieces in a transparent supporting material, each piece having an outer first type conductivity region and an inner second type conductivity region separated therefrom by a p-n junction; making an ohmic contact to each of said first type conductivity regions; depositing a first metal layer so as to electrically connect together the ohmic contacts of said first type conductivity regions; removing said outer first type conductivity region from a portion of each of said pieces, thereby exposing said inner second type conductivity regions, each of said exposed second type conductivity regions facing generally the same direction; covering said first metal layer and a portion of each of said exposed second type conductivity regions with an insulating material; making an ohmic contact to each of said second type conductivity regions; and depositing a second metal layer so as to connect together electrically the ohmic contacts of said second type conductivity regions.

4. A method as defined in claim 3 in which said supporting material is non-conductive.

5. A method of making a large area solar cell panel comprising the steps of: partially embedding a plurality of semiconductor pieces in a transparent supporting material, each piece having an outer first type conductivity region and an inner second type conductivity region separated therefrom by a p-n junction; depositing a first metal layer so as to ohmically connect together each of said first type conductivity regions; removing said outer first type conductivity region from a portion of each of said pieces, thereby exposing said inner second type conductivity regions; covering said first metal layer with an insulating material; and depositing a second metal layer so as to ohmically connect together each of said second type conductivity regions.

6. A method of making a large area solar cell panel comprising the steps off: cutting a transparent plastic sheet to the desired size of the panel; calendering a liquid plastic layer onto said plastic sheet; partially embedding a plurality of semiconductor pieces in said plastic layer, each piece having an outer first-type conductivity region separated from an inner second-type conductivity region by a p-n junction; hardening said plastic layer; making an ohmic contact to each of said first-type conductivity regions; depositing a first metal layer so as to electrically connect together the ohmic contacts of said first-type conductivity regions; covering said first metal layer with an insulating material; removing said outer first-type conductivity region from a portion of each of said pieces, thereby exposing said inner second-type conductivity regions, each of said exposed second-type conductivity regions facing generally the same direction; etching said exposed regions to clean the edge of each exposed p-n junction; covering the junction surfaces and a portion of each of said exposed second-type conductivity regions with an insulating material; making an ohmic contact to each of said second-type conductivity regions; and depositing a second metal layer so as to connect together electrically the ohmic contacts of said second-type conductivity regions.

7. A method of making a large area solar cell panel comprising the steps of: cutting a transparent plastic sheet to the desired size of the panel; calendering a liquid plastic layer onto said plastic sheet; partially embedding a plurality of semiconductor pieces in said plastic layer, each piece having an outer first-type conductivity region separated from an inner second-type conductivity region by a p-n junction; hardening said plastic layer; electrolessly plating an ohmic contact to each of said first-type conductivity regions; depositing a first metal layer by precipitation so as to connect together electrically the ohmic contacts of said first-type conductivity regions; electrodepositing a second metal layer upon said first metal layer to reduce the resistance thereof; covering said second metal layer with an insulating material; removing said outer first-type conductivity region from a portion of each of said pieces, thereby exposing said inner second-type conductivity regions, each of said exposed second-type conductivity regions facing generally the same direction; etching said exposed regions to clean the edge of each exposed p-n junction; covering the exposed p-n junctions and each of said exposed second-type conductivity regions with an insulating material; removing said insulating material so that each second-type conductivity region is just exposed; electrolessly plating an ohmic contact to each of said second-type conductivity regions; depositing a third metal layer by precipitation so as to connect together electrically the ohmic contacts of said second-type conductivity regions; and electrodepositing a fourth metal layer upon said third metal layer to reduce the resistance thereof.

References Cited in the file of this patent

UNITED STATES PATENTS

| | | |
|---|---|---|
| 1,995,200 | Cubitt et al. | Mar. 19, 1935 |
| 2,550,381 | Rouy | Apr. 24, 1951 |
| 2,732,469 | Palmer | Jan. 24, 1956 |
| 2,820,841 | Carlson et al. | Jan. 21, 1958 |
| 2,852,648 | Duffield | Sept. 16, 1958 |
| 2,861,909 | Ellis | Nov. 25, 1958 |
| 2,899,659 | McIlvaine | Aug. 11, 1959 |
| 2,904,613 | Paradise | Sept. 15, 1959 |